(12) United States Patent
Kim et al.

(10) Patent No.: US 7,733,434 B2
(45) Date of Patent: *Jun. 8, 2010

(54) LIQUID CRYSTAL DISPLAY INCLUDING BUFFER ELECTRODES WITH HIGHER VOLTAGE THAN PIXEL ELECTRODES, ON SAME LAYER WITH PIXEL ELECTRODES, AND OVERLAPPING A GATE LINE

(75) Inventors: Jong-Lae Kim, Seoul (KR);
Byeong-Seob Ban, Yongin-si (KR);
So-Youn Park, Suwon-si (KR);
Joon-Hak Oh, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 260 days.

This patent is subject to a terminal disclaimer.

(21) Appl. No.: 11/739,359

(22) Filed: Apr. 24, 2007

(65) Prior Publication Data

US 2007/0216627 A1     Sep. 20, 2007

Related U.S. Application Data

(63) Continuation of application No. 11/174,277, filed on Jul. 1, 2005, now Pat. No. 7,220,992.

(30) Foreign Application Priority Data

Jul. 8, 2004     (KR) ...................... 10-2004-0052918

(51) Int. Cl.
G02F 1/1343     (2006.01)
G02F 1/136     (2006.01)
G02F 1/137     (2006.01)

(52) U.S. Cl. ............................. 349/48; 349/33; 349/39; 349/139; 349/143

(58) Field of Classification Search ................... 349/33, 349/48

See application file for complete search history.

(56) References Cited

U.S. PATENT DOCUMENTS 7,220,992 B2 *  5/2007  Kim et al. ...................... 257/59
7,433,007 B2 * 10/2008  Yang et al. ................... 349/144

FOREIGN PATENT DOCUMENTS

WO     WO 2004023201 A1 *  3/2004

* cited by examiner

Primary Examiner—Andrew Schechter
(74) Attorney, Agent, or Firm—F. Chau & Associates, LLC

(57) ABSTRACT

A liquid crystal display, including a thin film transistor array panel, a common electrode panel including a common electrode and facing the thin film transistor array panel, and a liquid crystal layer disposed between the thin film transistor array panel and the common electrode panel, wherein the thin film transistor array panel, includes a substrate, gate lines formed on the substrate, data lines intersecting, and insulated from, the gate lines, pixel electrodes formed in intersection areas of the gate and data lines, first thin film transistors electrically connected to the gate lines, the data lines, and the pixel electrodes, and buffer electrodes being supplied with a first voltage higher than a second voltage of the pixel electrodes when a corresponding pixel electrode is supplied with a data voltage and located at a boundary of the intersection areas in which they are formed and overlapping a portion of the gate line adjacent to the boundary.

12 Claims, 6 Drawing Sheets

LIQUID CRYSTAL DISPLAY INCLUDING BUFFER ELECTRODES WITH HIGHER VOLTAGE THAN PIXEL ELECTRODES, ON SAME LAYER WITH PIXEL ELECTRODES, AND OVERLAPPING A GATE LINE

CROSS-REFERENCE TO RELATED APPLICATIONS

This application is a Continuation of U.S. patent application Ser. No. 11/174,277 filed Jul. 1, 2005, now U.S. Pat. No. 7,220,992 which claims priority to Korean Application No. 2004-0052918 filed Jul. 8, 2004, the disclosures of which are incorporated by reference herein in their entirety.

TECHNICAL FIELD

The present invention relates to a thin film transistor array panel and a liquid crystal display including the same.

DISCUSSION OF THE RELATED ART

A typical liquid crystal display (LCD) includes an upper panel provided with a common electrode and color filters, etc., a lower panel provided with a plurality of thin film transistors (TFTs) and a plurality of pixel electrodes, etc., and a liquid crystal (LC) material having LC molecules interposed between the panels. The pixel electrodes and the common electrode are supplied with different voltages to generate an electric field, which changes the orientations of the LC molecules, thereby controlling light transmittance to display desired images.

Recently, optically compensated birefringence (OCB) mode or hybrid aligned nematic (HAN) mode LCDs have been developed and used for improving response time of LC molecules and a viewing angle.

A wide viewing angle of the OCB mode LCD can be realized by having a bend arrangement of the LC molecules including horizontal and vertical alignments from the surfaces of the upper and lower panels to the center between the upper and lower panels, and a symmetrical alignment with respect to the center between the upper and lower panels. To achieve the bend arrangement of the LC molecules, the alignment layers of the panels are homogenous with the same alignment direction, and the LC molecules are driven by a voltage higher than a threshold voltage. A rapid response time of the LC molecules may be achieved by tilting the LC molecules with the same direction by using the homogenous alignment in the OCB mode LCD.

To make the OCB mode LCD, the LC modules are substantially vertically aligned with the panels of the LCD by applying a highest drive voltage in an initial stage to the screen of the LCD in a black state. To display an image, the LC is driven with a voltage equal to or higher than a threshold voltage, which can maintain the bend arrangement, while the screen of the LCD is in a white state.

An OCB mode LCD, however, tends to deteriorate display quality of the LCD screen because the bend arrangement of the LC molecules may break around the edges over time. In particular, the upper and lower portions of pixels of the LCD screen break when the screen is in the white state while maintaining the threshold voltage.

SUMMARY OF THE INVENTION

A thin film transistor array panel is provided, which includes: a substrate; a plurality of first signal lines formed on the substrate; a plurality of second signal lines intersecting, and insulated from, the first signal lines; a plurality of pixel electrodes formed in intersection areas of the first and second signal lines; a plurality of first thin film transistors terminals respectively connected to the first signal lines, the second signal lines, and the pixel electrodes; a plurality of buffer electrodes capacitively coupled to the pixel electrodes and located at a boundary of the intersection areas; and a plurality of second thin film transistors having terminals, respectively connected to the buffer electrodes and the first signal lines, wherein the first signal lines are connected to the pixel electrodes of a previous row.

The panel may further include coupling electrodes connected to the pixel electrodes, the coupling electrodes overlapping, and insulated from, the buffer electrodes.

The coupling electrodes may be connected to drain electrodes of the first thin film transistors.

The panel may further include a plurality of third signal lines intersecting the second signal lines, and one terminal of the second thin film transistor may be connected to the third signal lines.

The pixel electrodes and the buffer electrodes may be located on the same layer.

The panel may further include a gate insulating layer formed between the first signal line and the second line; and a passivation layer formed between the second signal line and the pixel electrodes. The buffer electrodes may be connected to the pixel electrodes through a contact hole of the passivation layer.

The buffer electrodes may overlap the first signal line.

A liquid crystal display is provided, which includes: a first substrate; a plurality of gate lines formed on the first substrate and including a first electrode and a second electrode; a plurality of storage electrode lines formed on the first substrate; a gate insulating layer covering the gate lines and the storage electrode lines; a plurality of first and second semiconductors formed on the gate insulating layer; a plurality of data lines having first source electrodes formed on the first semiconductor; a plurality of second source electrodes formed on the second semiconductor; a plurality of first and second drain electrodes respectively formed on the first and second semiconductors and respectively disposed opposite the first and second source electrodes; a plurality of coupling electrodes connected to the first drain electrode and formed on the gate insulating layer; a passivation layer covering the data lines, the first and second drain electrodes, and the coupling electrodes; a plurality of pixel electrodes formed on the passivation layer and connected to the first drain electrode and the coupling electrode; a plurality of buffer electrodes overlapping the coupling electrode and connected to the second drain electrode; a second insulating substrate disposed opposite the first insulating substrate; and a common electrode formed on the second substrate.

The second source electrode may be connected to the storage electrode line, and the buffer electrode may overlap the gate line.

BRIEF DESCRIPTION OF THE DRAWINGS

The present invention will become more apparent by describing exemplary embodiments thereof in detail with reference to the accompanying drawings in which.

DETAILED DESCRIPTION OF EXEMPLARY EMBODIMENTS

Figure 1:
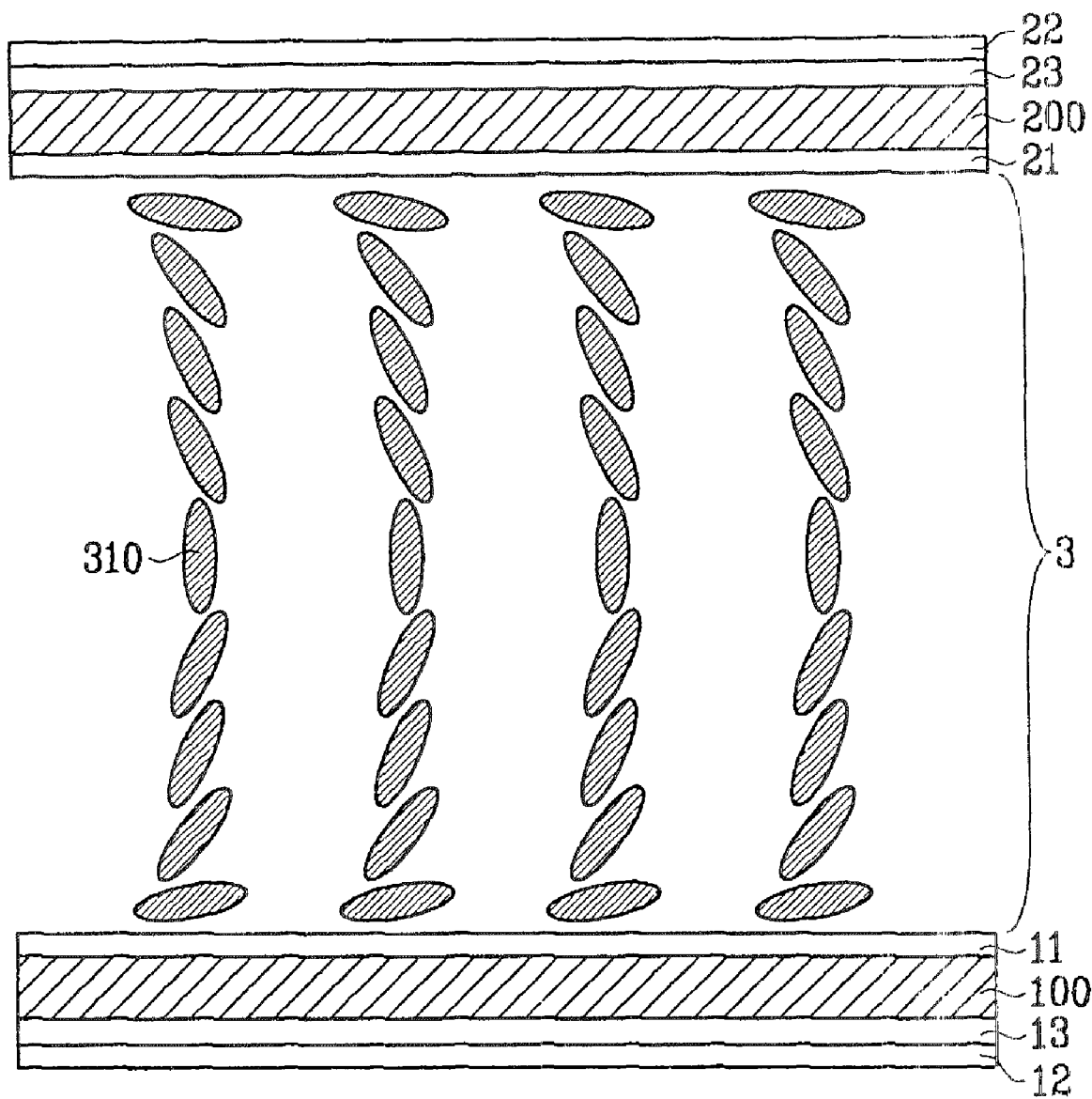
FIG. 1 is a schematic sectional view of an LCD having a bend arrangement of LC molecules according to an exemplary embodiment of the present invention.

The present invention will be described more fully hereinafter with reference to the accompanying drawings, in which exemplary embodiments of the invention are shown. The present invention may, however, be embodied in many different forms and should not be construed as limited to the embodiments set forth herein.

In the drawings, the thickness of layers, films, and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, liquid crystal displays (LCDs) and the thin film transistor (TFT) array panels for LCDs according to exemplary embodiment of the present invention will be described with reference to the accompanying drawings.

Figure 2:
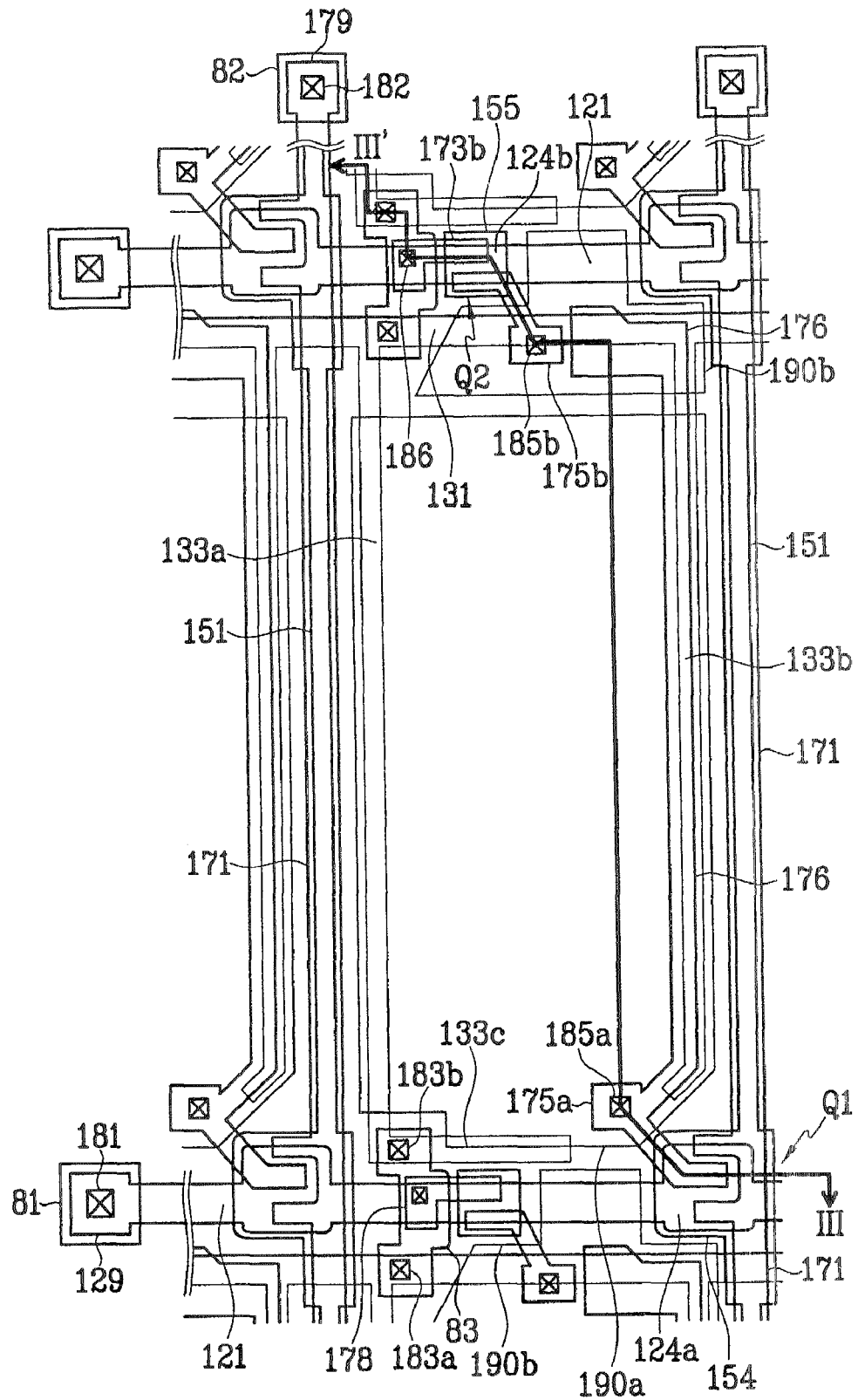
FIG. 2 is a layout view of a TFT array panel of an LCD according to an exemplary embodiment of the present invention.
Figure 3:
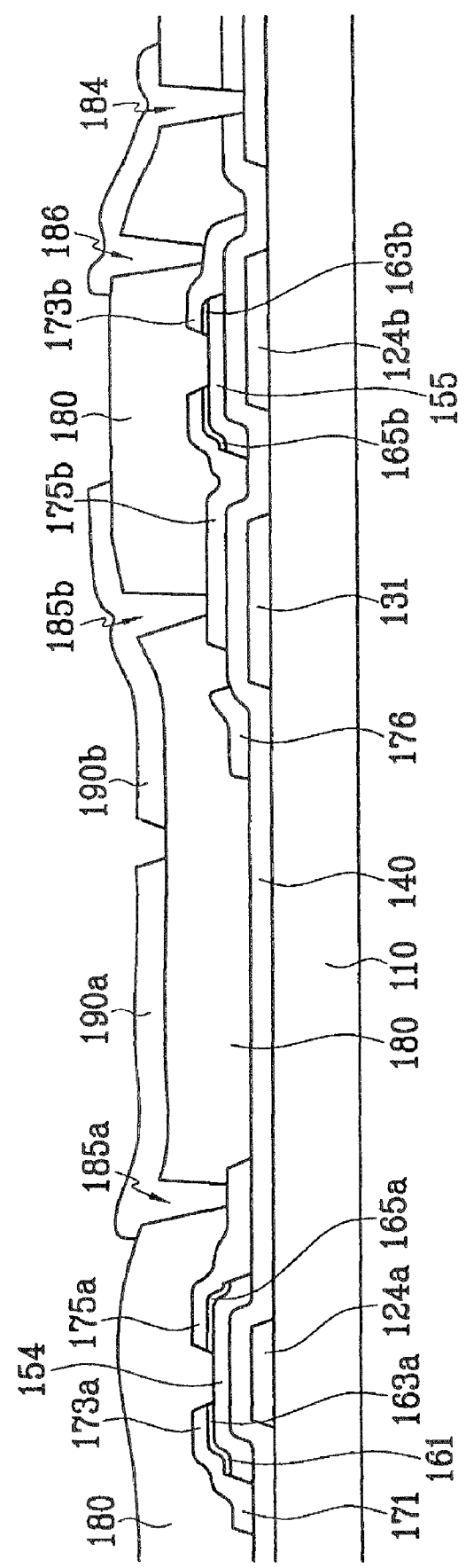
FIG. 3 is a sectional view of the TFT array panel shown in FIG. 3 taken along the line III-III'.
Figure 4:
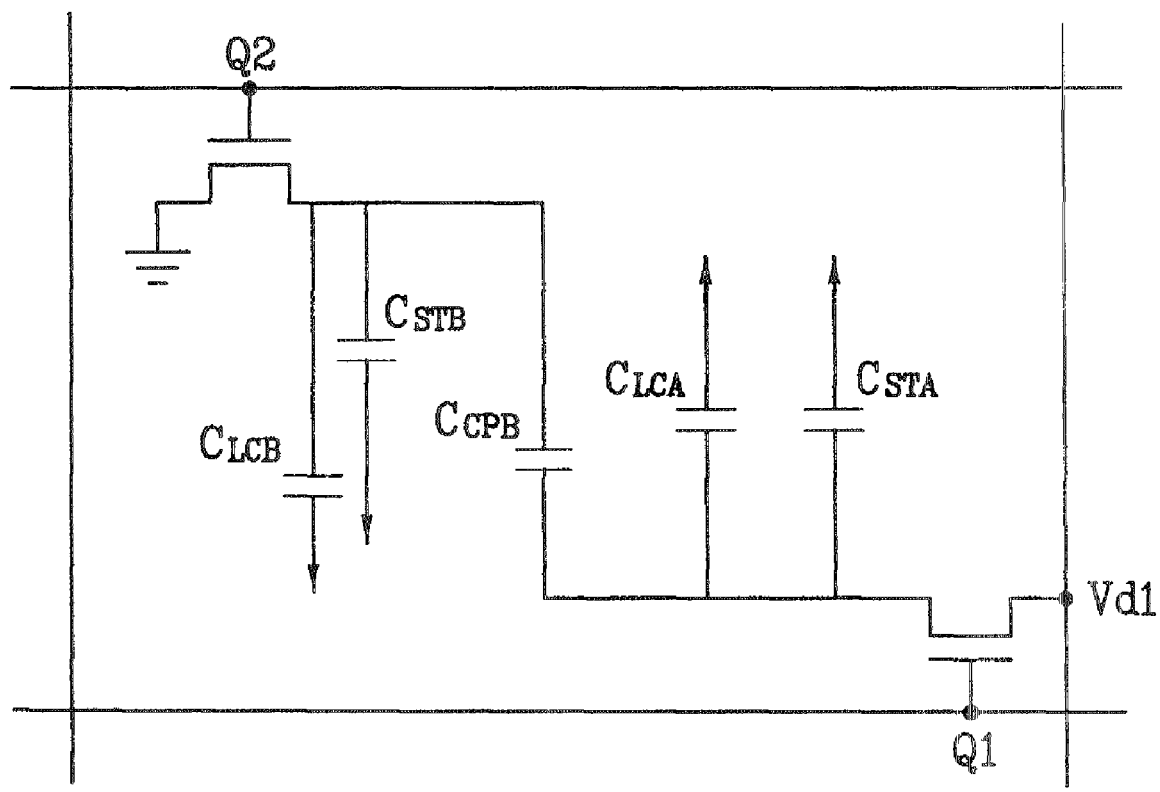
FIG. 4 is an equivalent circuit of the LCD including the TFT panel shown in FIGS. 2 and 3.

FIG. 1 is a schematic sectional view of an LCD having a bend arrangement of LC molecules according to an embodiment of the present invention; FIG. 2 is a layout view of a TFT array panel of an LCD according to an embodiment of the present invention; FIG. 3 is a sectional view of the TFT array panel shown in FIG. 3 taken along the line III-III'; and FIG. 4 is an equivalent circuit of the LCD including the TFT array panel shown in FIGS. 2 and 3.

An LCD according to an embodiment of the present invention includes: a TFT array panel 100; a common electrode panel 200; an LC layer 3 interposed between the panels 100 and 200 and including LC molecules 310; a pair of retardation films (or compensation films) 13 and 23 attached to outer surfaces of the panels 100 and 200; a pair of alignment layers 11 and 21 coated on inner surfaces of the panels 100 and 200; and a pair of polarization films 12 and 22 attached to outer surfaces of the retardation films 13 and 23. The retardation films 13 and 23 may include hybrid C plate or biaxial optical compensation films.

The LC layer 3 has positive dielectric anisotropy and it is subjected to a horizontal alignment in which the LC molecules 310 are aligned such that their longitudinal axes are substantially parallel to the surfaces of the panels 100 and 200 in the absence of an electric field.

Upon application of an electric field, an electric field substantially perpendicular to the surfaces of the panels 100 and 200 is generated. The LC molecules 310 tend to change their orientations in response to the electric field such that their longitudinal axes are parallel to the direction of the electric field. Accordingly, the LC molecules 310 adjacent to the surfaces of the panels 100 and 200 are pre-tilted at an angle by alignment forces of the pair of alignment layers 11 and 21 and by characteristics of the LC molecules 310, and the LC molecules 310 in the center between the two panels 100 and 200 are substantially vertically aligned with the panels 100 and 200 by the electric field. The bend arrangement is realized by gradually changing the tilt directions of the LC molecules 310 from the surfaces of the panels 100 and 200 to the center between the two 100 and 200.

As shown in FIG. 1, the LC molecules 310 are divided into two regions and have a symmetrical alignment with respect to the center between the two panels 100 and 200. The LC layer 3 of the bend arrangement generates a phase retardation with respect to the light incident to the LC layer 3 to display images. In the above-described LCD, a wide viewing angle of an OCB mode LCD is realized by forming the phase retardation symmetrically with respect to the center between the two panels 100 and 200.

The alignment layers 11 and 21 of the panels 100 and 200 are homogenous to substantially align the LC molecules 310 parallel to the surfaces of the two panels 100 and 200, and the alignment directions of the alignment layers are the same to form the symmetrical alignment with respect to the center between the two panels 100 and 200, and to achieve the bend arrangement of the LC molecules 310, when the LC molecules 310 are driven with a voltage higher than a threshold voltage. The alignment layers 11 and 21 may also be rubbed.

Now, a TFT array pixel 100 for LCDs according to exemplary embodiments of the present invention will be described with reference to FIGS. 2 and 3.

A pixel electrode 190a and a buffer electrode 190b are formed on an insulating substrate 110, such as a transparent glass. It is preferable that the pixel electrode 190a and the buffer electrode 190b are made of a transparent conductor such as indium tin oxide (ITO) or indium zinc oxide (IZO), and are located at the same layer. The pixel electrode 190a is physically and electrically connected to a first thin film transistor Q1 to receive data voltages, and the buffer electrode 190b is connected to a previous gate line 121, which supplies a scanning signal or gate signal to a pixel of a previous row, and a storage electrode line 131. Also, the buffer electrode 190b is capacitively coupled to the pixel electrode 190a by overlapping a coupling electrode 176 connected to the pixel electrode 190a. The thin film transistor Q1 is connected to the gate line 121 for supplying a scanning signal, and a data line 171 for supplying a data signal, and controls a data signal supplied to the pixel electrode 190a according to the scanning signal. The pixel electrode 190a and the buffer electrode 190b may be made of an opaque conductor in a reflective type LCD.

In the common electrode panel 200 of, for example, FIG. 1, a light blocking member called a black matrix for preventing light leakage, a plurality of color filters representing one of the primary colors, e.g., red, green, and blue, and a common electrode made of transparent conductive material such as ITO and IZO are formed on an insulating substrate. The common electrode forms an electric field with, for example, the pixel electrode 190a, and the black matrix and the color filters may be formed in the TFT array panel 100.

The TFT array panel 100 is now described in detail with reference to FIGS. 2 and 3.

A plurality of gate lines 121 and a plurality of storage electrode lines 131 are formed on an insulating substrate 110, such as transparent glass.

The gate lines 121 extend substantially in a transverse direction, separate from each other, and transmit gate signals. Each gate line 121 includes a plurality of projections, forming a plurality of gate electrodes 124a of the first thin film transistor Q1, and an end portion 129 having a large area for contact with another layer or an external driving circuit. The portions of previous gate lines 121, which supply a scanning or gate signal to a pixel of a previous row, are a plurality of gate electrodes 124b of the second thin film transistor Q2.

Each storage electrode line 131 extends substantially in the transverse direction and is disposed between two adjacent gate lines 121, closer to the upper of the two gate lines 121. Each storage electrode line 131 includes a plurality of sets of branches 133a and 133b.

A set of the branches 133a and 133b includes two longitudinal branches forming first and second storage electrodes 133a and 133b which are spaced apart from each other. In detail, the first storage electrode 133a has a free end portion, a fixed end portion connected to the storage electrode line 131, and a projection.

The gate lines 121 and the storage electrode lines 131 are preferably made of an Al containing metal such as Al and Al alloy, Ag containing metal such as Ag and Ag alloy, or a Mo containing metal such as Mo and Mo alloy, Cr, Ti, or Ta. The gate lines 121 and the storage electrode lines 131 may have multi-layered structures including two films having different physical characteristics. One of the two films is preferably made of a low resistivity metal, including an Al containing metal and an Ag containing metal, for reducing signal delay or voltage drop in the gate lines 121 and the storage electrode lines 131. The other film is preferably made of a material such as a Mo containing metal, Cr, Mo, Ta, or Ti, which has good physical, chemical, and electrical contact characteristics with other materials such as indium tin oxide (ITO) or indium zinc oxide (IZO). The gate lines 121 and the storage electrode lines 131 are preferably made of various metals or conductors in addition to the above described materials.

In addition, the lateral sides of the gate lines 121 and the storage electrode lines 131 are inclined relative to a surface of the substrate, and the inclination angle thereof ranges from about 20-80 degrees.

A gate insulating layer 140 preferably made of silicon nitride (SiNx) is formed on the gate lines 121 and the storage electrode lines 131.

A plurality of semiconductor stripes 151 preferably made of hydrogenated amorphous silicon (a-Si) or polysilicon are formed on the gate insulating layer 140. Each semiconductor stripe 151 extends substantially in the longitudinal direction and has a plurality of projections 154 branched out toward the gate electrodes 124a of the thin film transistor Q1. The semiconductor stripes 151 become wide near the gate lines 121 and the storage electrode lines 131 such that the semiconductor stripes 151 cover large areas of the gate lines 121 and the storage electrode lines 131. Also, a plurality of semiconductor islands 155, which form the channel of the second thin film transistor Q2, are formed on the gate insulating layer 140 of the previous gate lines 121.

A plurality of ohmic contact stripes and islands 161 and 165a, preferably made of silicide or n+ hydrogenated a-Si heavily doped with an N-type impurity such as phosphorous, are formed on the semiconductor stripes 151. Each ohmic contact stripe 161 has a plurality of projections 163a, and the projections 163a, and the ohmic contact islands 165a are located in pairs on the projections 154 of the semiconductor stripes 151. Also, a plurality of ohmic contact islands 163b and 165b are formed on the semiconductor islands 155.

A plurality of data lines 171, a plurality of drain electrodes 175a of the first thin film transistor Q1, a plurality of coupling electrodes 176, and a plurality of isolated metal pieces 178 are formed on the ohmic contacts 161 and 165a and the gate insulating layer 140.

The data lines 171 for transmitting data voltages extend substantially in the longitudinal direction and cross the gate lines 121 at right angles. The data lines 171 also intersect the storage electrode lines 131 such that each data line 171 is disposed between the first and second storage electrodes 133a and 133b in adjacent sets of the branches 133a and 133b of the storage electrode lines 131. Each data line 171 includes an end portion 179 having a large area for contact with another layer or an external device. Each data line 171 includes a plurality of source electrodes 173a projecting toward the drain electrodes 175a.

Each drain electrode 175a includes an end portion having a large area for contact with another layer and another end portion disposed on a gate electrode 124a and partly enclosed by the source electrode 173a. The gate electrode 124a, source electrode 173a, and drain electrode 175a, along with the projection 154 of the semiconductor stripe 151, form a TFT having a channel formed in the projection 154 disposed between the source electrode 173a and the drain electrode 175a.

The metal pieces 178 are disposed on the gate lines 121 near the end portions of the storage electrodes 133a. The portion of the metal pieces 178 is a source electrode 173b of the second thin film transistor Q2 that is extended on the previous gate line 121. A plurality of drain electrodes 175b of the second thin film transistor Q2 are located on the gate lines 121 and opposite the source electrodes 173b. Each drain electrode 175b of the second thin film transistor Q2 includes and end portion having a large area for contact with another layer and located on the storage electrode line 131. The source and the drain electrodes 173b and 175b are disposed on the ohmic contacts 163b and 165b.

The coupling electrodes 176 are respectively connected to the drain electrodes 175a of the first thin film transistor Q1 and are located at the edge of a pixel. The coupling electrodes 176 overlap the storage electrode 133b and are extend under the storage electrode line 131.

The data lines 171, the source electrodes 173a and 173b, the drain electrodes 175a and 175b, and the metal pieces 178 are preferably made of a refractory metal such as Cr, Al, or alloys thereof, like the gate lines 121. However, they may also have a multilayered structure including a low-resistivity film and a good-contact film.

The ohmic contacts 161, 165a, 163b, and 165b are respectively interposed only between the underlying semiconductor stripes and islands 151 and 155 and the overlying data lines 171 and the source electrode 173b, and the overlying drain electrodes 175a and 175b thereon, and reduce the contact resistance therebetween. The semiconductor stripes and islands 151 and 155 include a plurality of exposed portions, which are not covered with the data lines 171 and the source electrodes 173b, of the drain electrodes 175a and 175b, such as portions located between the source electrodes 173a and 173b and the drain electrodes 175a and 175b.

A passivation layer 180 is formed on the data lines 171, the drain electrodes 175a and 175b, the metal pieces 178, the coupling electrode 176, and the exposed portions of the semiconductor stripes and islands 151 and 155. The passivation layer 180 preferably includes an inorganic insulator, such as silicon nitride or silicon oxide, an organic material having a good fatness characteristic, or a low dielectric insulating material.

The passivation layer 180 has a plurality of contact holes 182, 185a, and 185b exposing the end portions 179 of the data lines 171 and the end portions of the drain electrodes 175a and 175b, respectively. The passivation layer 180 and the gate insulating layer 140 have a plurality of contact holes 181 exposing the end portions 129 of the gate lines 171, a plurality of contact holes 183a exposing portions of the storage electrode lines 131 near the fixed end portions of the first storage electrodes 133a, and a plurality of contact holes 183b exposing the projections of the free end portions of the first storage electrodes 133a. The passivation layer 180 has a plurality of contact holes 186 exposing the drain electrodes 173b of the second thin film transistor Q2.

The plurality of pixel electrodes 190a, plurality of buffer electrodes 190b, a plurality of contact assistants 81 and 82, and a plurality of overpasses 83, which are preferably made of a transparent conductor such as ITO or IZO, or a reflective conductor such as Al, are formed on the passivation layer 180.

The pixel electrodes 190a are physically and electrically connected to the drain electrodes 175a of the first film transistor Q1 through the contact holes 185a such that the pixel electrodes 190a receive the data voltages from the drain electrodes 175a.

The buffer electrodes 190b are physically and electrically connected to the drain electrodes 175b of the second thin film transistor Q2 through the contact holes 185b, and overlap the coupling electrode 176 connected to the drain electrode 175a. Accordingly, the buffer electrode 190b is capacitively coupled with the pixel electrode 190a.

The overpasses 83 cross over the gate lines 121 and are connected to the exposed projection of the fixed end portions of the first storage electrodes 133a and the exposed portions of the storage electrode lines 131 through the contact holes 183b and 183a, respectively, which are disposed opposite each other with respect to the gate lines 121. The overpasses 83 overlap the metal pieces 178 and may be electrically connected to the metal pieces 178 through the contact hole 186. When the second thin film transistor Q2 turns on by applying an ON voltage to the previous gate lines 121, the predetermined voltage, such as a common voltage or reference voltage, is supplied to the buffer electrode 190b. The overpasses 83 electrically connect all the storage lines 131 of the TFT panel 100.

The LCD including the TFT panel 100 shown in FIGS. 1-3 is represented as an equivalent circuit shown in FIG. 4.

Referring to FIG. 4, the LCD includes a plurality of gate lines, a plurality of data lines, and a plurality of pixels, and each pixel includes a coupling capacitor Ccpb. Each pixel includes a first/second LC capacitor Clca/Clcb, a first/second storage capacitor Csta/Cstb, and a first/second TFT Q1/Q2. The first/second LC capacitor Clca/Clcb is formed of the pixel electrode and the buffer electrode 190a/190b, a common electrode, and a region of an LC layer 3 disposed on the pixel electrode and the buffer electrode 190a/190b. The first/second storage capacitor Csta/Cstb is formed of the pixel electrode and the buffer electrode 190a/190b, the storage electrode line 131, and insulators 140 and 180 interposed therebetween. The first TFT Q1 is connected to the gate line 121, the data line 171 supplied with data voltages, and the capacitors Clca and Csta, while the second TFT Q2 is connected to a gate line 121 previous to the gate line connected to the TFT Q1, a storage electrode line 131 supplied with a common voltage, and the capacitors Clcb and Cstb. The coupling capacitor Ccpb is formed of the coupling electrode 176, the buffer electrode 190b, and the insulator 140 interposed therebetween, and is connected between output terminals of the TFTs Q1 and Q2.

Now, behavior of a pixel is described in detail.

When the previous gate line connected to the second TFT Q2 is supplied with a gate-on voltage, the second TFT Q2 turns on to transmit the common voltage, which is applied to the storage lines 131, to the buffer electrode 190b, which in turn is refreshed by the common voltage. When the previous gate line is supplied with a gate-off voltage, the buffer electrode 190b becomes floating. When the current gate line connected to the first TFT Q1 is supplied with a gate-on voltage, the first TFT Q1 turns on to transmit a data voltage to the pixel electrode 190a. Because the buffer electrode 190b is floating and capacitively coupled to the pixel electrode 190a through coupling capacitor Ccpb, the voltage of the buffer electrode 190b is changed by the capacitive coupling. The capacitive coupling changes the voltage of the buffer electrode 190b to a level higher than that the voltage level of the pixel electrode 190a, which will now be described in detail.

The voltage across the first LC capacitor Clca is denoted by Va (=Vd1), and the voltage across the second LC capacitor Clcb is denoted by Vb. The voltage distribution results in:

$$Vb \approx 1/(C_1+2C_2) \times [(2-C_3/C_2) \times (C_1+C_2) \times Vd1],$$

where C1=Clca+Csta, C2=Ccpb, and C3=Clcb+Cstb, and capacitances of the capacitors Clca, Csta, Clcb, Cstb, and Ccpb are denoted by the same characters as those of the capacitors Clca, Csta, Clcb, Cstb, and Ccpb. Parasitic capacitances between terminals of the TFTs Q1 and Q2 are of negligible levels.

The voltage Vb can be controlled such that the voltage Vb approaches the voltage Va but is always higher than the voltage Va, by adjusting the capacitances Clca, Csta, Clcb, Cstb, and Ccpb. In particular, the ratio of the voltages Va and Vb can be effectively controlled by adjusting the capacitance Ccpb.

In the above-described LCD according to an embodiment of the present invention, because the voltage Vb of the buffer electrodes 190b, which are located at the upper and lower portions of a pixel, is always higher than the voltage Va, the bend arrangement of the LC molecules on the edge of the pixels, particularly the portions overlapping the gate lines 121, is not broken ever over a long time with application of the threshold voltage. Accordingly, an aperture ratio of a pixel may be maximized when the screen of the LCD is in the white state while maintaining the threshold voltage, such that the contrast ratio and brightness of the LCD may be improved. Furthermore, because the threshold voltage may be minimized, the range of the driving voltage is extendible.

An LCD according to another exemplary embodiment of the present invention will be described in detail with reference to FIGS. 5 and 6.

Figure 5:
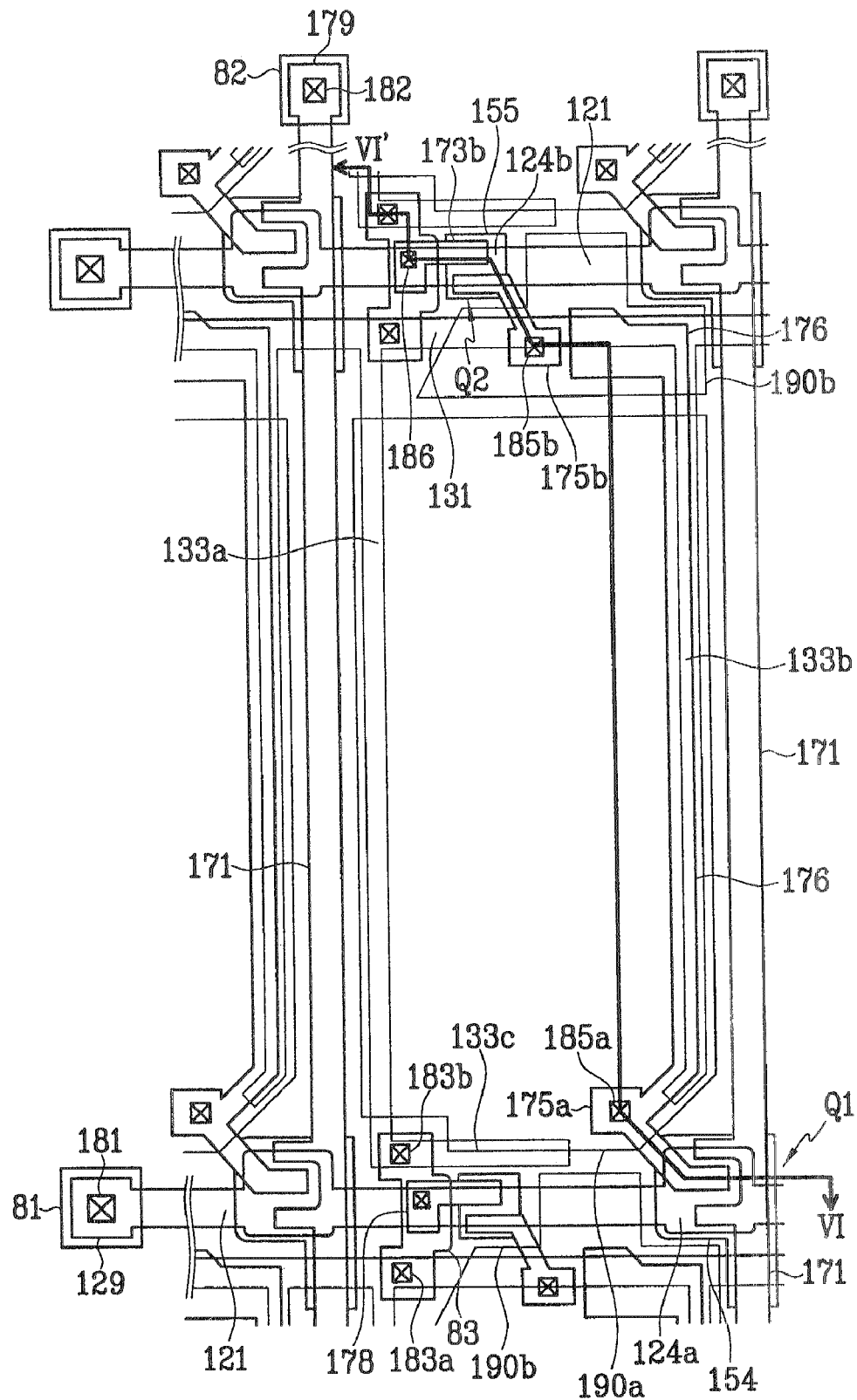
FIG. 5 is a layout view of a TFT array panel according to another exemplary embodiment of the present invention.
Figure 6:
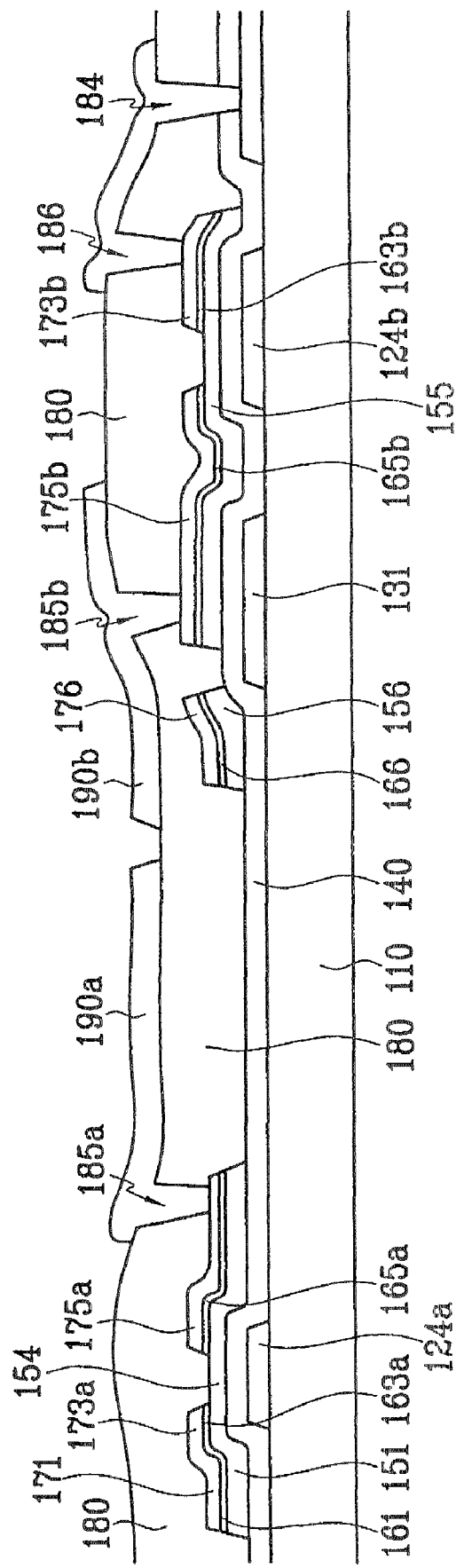
FIG. 6 is a sectional view of the TFT array panel shown in FIG. 5 taken along the line VI-VI'.

FIG. 5 is a layout view of a TFT panel of an LCD according to another exemplary embodiment of the present invention, and FIG. 6 is a sectional view of the TFT shown in FIG. 5 taken along the line VI-VI'.

Referring to FIGS. 5 and 6, layered structures of the TFT panel according to this embodiment are almost the same as those shown in FIGS. 2-3.

Regarding the TFT array panel, a plurality of gate lines 121 including gate electrodes 124a and 124b and end portions 129, and a plurality of storage electrode lines 131 are formed on a substrate 110, and a gate insulating layer 140, a plurality of semiconductor stripes 151, including projections 154, and semiconductor islands 155, and a plurality of ohmic contact stripes 161, including projections 163a, and ohmic contact islands 165a, 163b, and 165b are sequentially formed thereon. A plurality of data lines 171, including first source electrodes 173a and end portions 179, a plurality of first and second drain electrodes 175a and 175b, a plurality of second source electrodes 173b, and a plurality of isolated metal pieces 178 are formed on the ohmic contacts 161 and 163b, 165a, and 165b, and a passivation layer 180 is formed thereon. A plurality of contact holes 181, 182, 183a, 183b, 186, 185a, and 185b are provided at the passivation layer 180 and the gate insulating layer 140. A plurality of pixel electrodes 190a, a plurality of buffer electrodes 190b, a plurality of contact assistants 81 and 82, and a plurality of overpasses 83 are formed on the passivation layer 180.

The semiconductor stripes 151 of TFT array panel according to this embodiment have almost the same planar shapes as the data lines 171 and the drain electrodes 175a as well as the underlying ohmic contacts 161 and 165a as shown in the TFT panel of FIGS. 2 and 3. However, the projections 154 of the semiconductor stripes 151 include some exposed portions, which are not covered with the data lines 171 and the first drain electrodes 175a, such as portions located between the first source electrodes 173a and the first drain electrodes 175a. Also, a plurality of ohmic contacts 163b and 165b are extended under the second source and drain electrodes 173b and 175b.

A manufacturing method of the TFT array panel according to an exemplary embodiment of the invention simultaneously forms the data lines 171, the first and second drain electrodes 175a and 175b, the second source electrode 173b, the metal pieces 178, the semiconductors 151 and 155, and the ohmic contacts 161, 163b, 165a, and 165b using one photolithography process.

In the above-described LCD according to an exemplary embodiment of the present invention, an aperture ratio of a pixel may be maximized, such that the contrast ratio and brightness of the LCD may be improved. Furthermore, because the threshold voltage may be minimized, the range of the driving voltage is extendible.

While the present invention has been described in detail with reference to the exemplary embodiments, those skilled in the art will appreciate that various modifications and substitutions can be made thereto without departing from the spirit and scope of the present invention as set forth in the appended claims.

What is claimed is:

1. A liquid crystal display, comprising:
    a thin film transistor array panel;
    a common electrode panel including a common electrode and facing the thin film transistor array panel; and
    a liquid crystal layer disposed between the thin film transistor array panel and the common electrode panel,
    wherein the thin film transistor array panel, comprises:
    a substrate;
    gate lines formed on the substrate;
    data lines intersecting, and insulated from, the gate lines;
    pixel electrodes formed in intersection areas of the gate and data lines;
    first thin film transistors electrically connected to the gate lines, the data lines, and the pixel electrodes; and
    buffer electrodes located on the same layer with the pixel electrodes and being supplied with a first voltage higher than a second voltage of the pixel electrodes when a corresponding pixel electrode is supplied with a data voltage and located at a boundary of the intersection areas in which they are formed and overlapping a portion of the gate line adjacent to the boundary.

2. The liquid crystal display of claim 1, further comprising:
    a first alignment layer formed on the thin film transistor array panel; and
    a second alignment layer formed on the common electrode panel,
    wherein the first and the second alignment layers are rubbed in the same direction.

3. The liquid crystal display of claim 2, wherein the first and the second alignment layers are homogenous.

4. The liquid crystal display of claim 2, wherein the liquid crystal molecules of the liquid crystal layer have a symmetrical alignment with respect to the center between the thin film transistor array panel and the common electrode panel.

5. The liquid crystal display of claim 4, wherein the liquid crystal molecules of the liquid crystal layer have a bend arrangement.

6. The liquid crystal display of claim 1, wherein the liquid crystal molecules of the liquid crystal layer are driven with a voltage equal to or higher than a threshold voltage to display images.

7. The liquid crystal display of claim 1, wherein the buffer electrodes are capacitively coupled to the pixel electrodes.

8. The liquid crystal display of claim 7, further comprising:
    a plurality of second thin film transistors electrically connected to the buffer electrodes and the gate lines that are electrically connected to the pixel electrodes of a previous row.

9. The liquid crystal display of claim 8, further comprising:
    coupling electrodes connected to the pixel electrodes, the coupling electrodes overlapping, and insulated from, the buffer electrodes.

10. The liquid crystal display of claim 9, wherein the coupling electrodes are connected to drain electrodes of the first thin film transistors.

11. The liquid crystal display of claim 8, further comprising:
    a plurality of storage electrode lines intersecting the data lines,
    wherein one of the terminals of the second thin film transistors is connected to the storage electrode lines.

12. The liquid crystal display of claim 1, wherein the buffer electrodes and the pixel electrodes are located on the same side of a passivation layer.

* * * * *